(12) United States Patent
Yen et al.

(10) Patent No.: US 10,879,111 B1
(45) Date of Patent: Dec. 29, 2020

(54) DIELECTRIC PLUGS

(71) Applicant: Taiwan Semiconductor Manufacturing Co., Ltd., Hsinchu (TW)

(72) Inventors: Fu-Ting Yen, Hsinchu (TW); Ting-Ting Chen, New Taipei (TW); Yu-Yun Peng, Hsinchu (TW); Keng-Chu Lin, Ping-Tung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/571,270

(22) Filed: Sep. 16, 2019

(51) Int. Cl.
*H01L 21/768* (2006.01)
*H01L 21/3105* (2006.01)
*H01L 21/30* (2006.01)
*H01L 21/02* (2006.01)

(52) U.S. Cl.
CPC .. *H01L 21/76832* (2013.01); *H01L 21/02247* (2013.01); *H01L 21/02532* (2013.01); *H01L 21/3003* (2013.01); *H01L 21/31053* (2013.01)

(58) Field of Classification Search
CPC ......... H01L 2924/0002; H01L 2924/00; H01L 21/76897; H01L 29/66545; H01L 29/785; H01L 29/66795; H01L 21/76802
See application file for complete search history.

(56) References Cited

U.S. PATENT DOCUMENTS 10,249,533 B1 * 4/2019 Shearer ............. H01L 21/82343
2019/0378842 A1 * 12/2019 Reznicek ............ H01L 29/4175

* cited by examiner

*Primary Examiner* — Jaehwan Oh
(74) *Attorney, Agent, or Firm* — Hayne and Boone LLP

(57) ABSTRACT

A method according to some embodiments of the present disclosure includes providing a workpiece that include an opening and a top surface, depositing a dielectric material over the workpiece and into the opening to form a first dielectric layer that has a top portion over the top surface and a plug portion in the opening, treating the first dielectric layer to convert top portion into a second dielectric layer different from the first dielectric layer, and selectively removing the second dielectric layer.

20 Claims, 13 Drawing Sheets

DIELECTRIC PLUGS

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. The number of planarization steps also increases with scaling down. For example, when dielectric plugs are to be formed within openings on a workpiece, a dielectric material is first deposited over the workpiece and then the excess dielectric material not in the opening is removed by a planarization step. In addition to challenges associated with reduction or prevention of contamination, delamination and defects, a planarization step, such as a chemical mechanical polishing (CMP) step, requires that the wafer be removed from a vacuum process chamber, planarized at a planarization station, and moved back into the vacuum process chamber. This results in reduction in throughput. Accordingly, although existing IC manufacturing processes have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
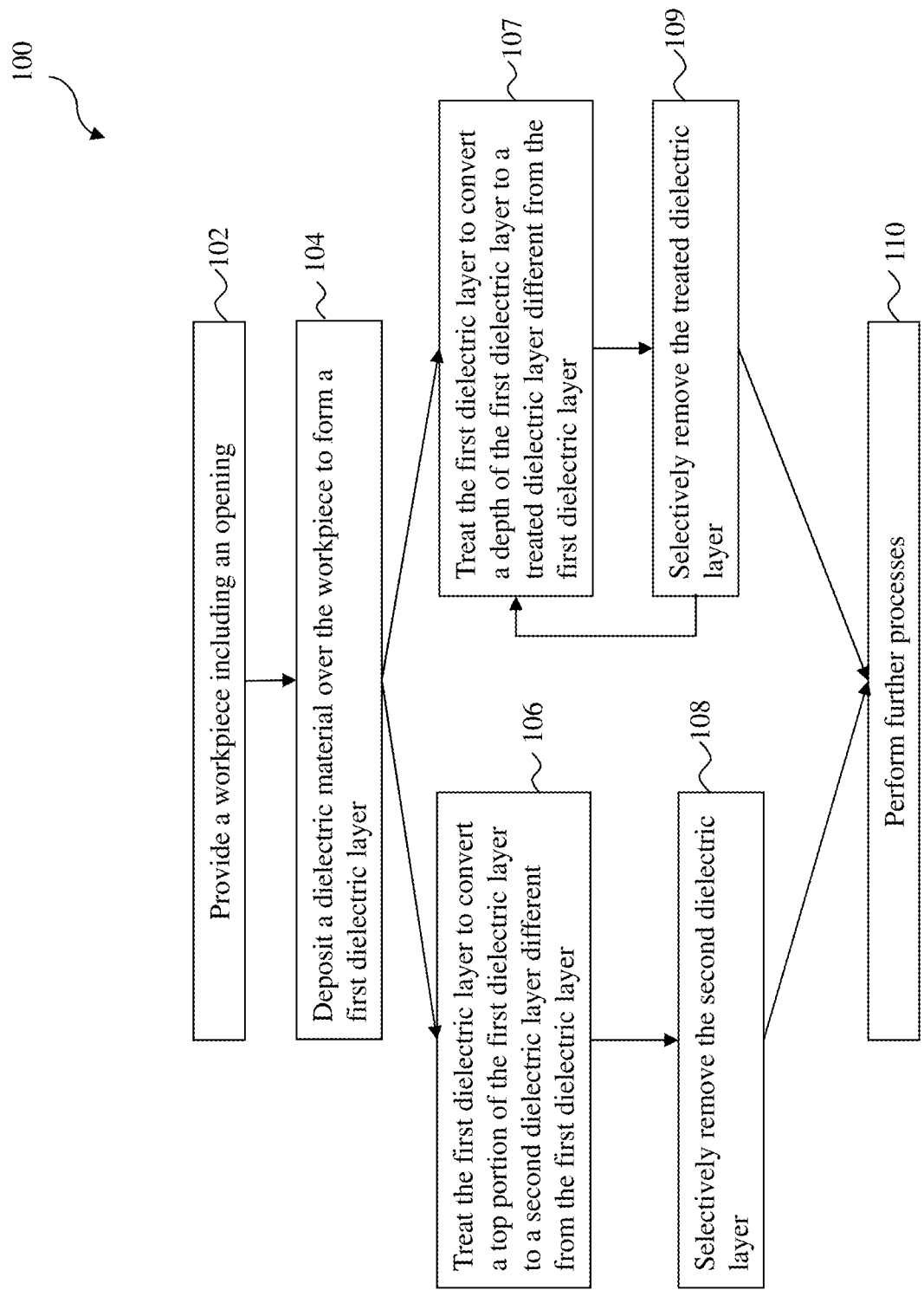
FIG. 1 is a flowchart of a method of forming a dielectric plug in a workpiece according to various aspects of the present disclosure in some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present application is generally related to formation of dielectric plugs in openings formed in a workpiece. More particularly, the present application is related to removing excess dielectric materials without any chemical mechanical polishing (CMP) steps. Conventionally, when openings in a workpiece are to be filled with dielectric plugs, a dielectric material is first deposited over the workpiece and a planarization step is performed to remove excess dielectric material on the top surface of the workpiece to form dielectric plugs. To put the dielectric plugs in perspective, the dielectric plugs may be part of an interlayer dielectric layer (ILD), gate cut dielectric features, fin cut dielectric features, or self-aligned contact (SAC) dielectric features.

The present disclosure provides various embodiments of a method of forming dielectric plugs in a workpiece. The method includes forming a first dielectric layer over a top surface of the workpiece and into the openings. A portion of the first dielectric layer over the top surface of the workpiece is treated in a treatment process to convert the portion of the first dielectric layer into a second dielectric layer. The second dielectric layer may then be selectively removed using a chemistry that is selective to the second dielectric layer. A planarization process, such as a CMP process, may be omitted such that the workpiece does not need to be removed from the process chamber and throughput may be improved. The treatment process may be an oxygenation process, a nitridation process, or a hydrogenation process.

FIG. 1 is a flowchart of a method 100 for forming a dielectric plug in a workpiece. Method 100 includes blocks 102, 104, 106, 108, and 110. Method 100 will be described in conjunction with diagrammatic cross-sectional views of a semiconductor structure 200 shown in FIGS. 2, 3, 4A-4D, 5A-5D, and 6. Additional steps may be provided before, during, and after method 100, and some of the steps described can be moved, replaced, eliminated for additional embodiments of method 100.

Figure 2:
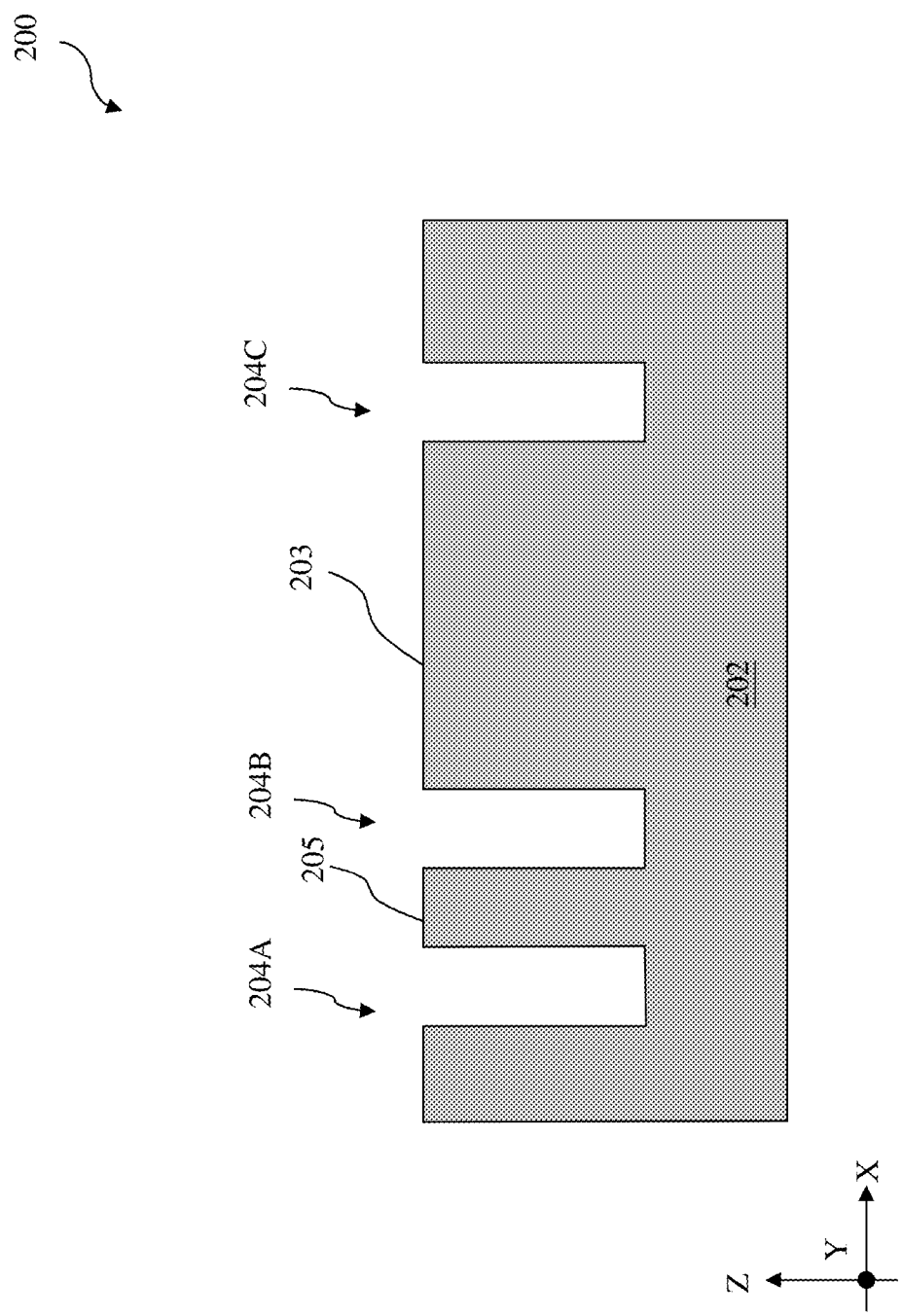
FIGS. 2, 3, 4A-4D, and 5A-5D are fragmentary cross-sectional views of a workpiece at various fabrication stages constructed according to some embodiments of the present disclosure.

Referring to FIGS. 1 and 2, the method 100 includes a block 102 where a workpiece 200 is provided and the workpiece 200 includes an opening, such as one of the first opening 204A, a second opening 204B and a third opening 204C, in the workpiece 200. For ease of reference, the first opening 204A, the second opening 204B and the third opening 204C may be collectively referred to as an opening 204 or openings 204. In some embodiments, the opening 204 may be a via opening that extends along the Z direction or a trench that extends along the Y direction. The workpiece 200 includes a substrate 202. The substrate 202 may include germanium, silicon germanium or other proper semiconductor materials. The substrate 202 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The substrate 202 may also include various doped regions such as n-well and p-wells. In one embodiment, the substrate 202 includes an epitaxy (or epi) semiconductor layer. In another embodiment, the substrate includes a buried dielectric material layer for isolation formed by a proper technology, such as a technology referred to as separation by implanted oxygen (SIMOX). In some embodiments, the substrate 202 may be a semiconductor on insulator, such as silicon on insulator (SOI).

Although not shown in the figures of the present disclosure, the workpiece 200 may also include a plurality of gate structures, a plurality of fin structures, a plurality of gate spacer layers formed along sidewalls of the plurality of gate structures, and other structures. It is noted that while method 100 is described in conjunction with embodiments where the openings 204 are one formed in the substrate 202 of the workpiece 200, as shown in FIGS. 2, 3, 4A-4D, 5A-5D, and 6, the present disclosure is not so limited. As will be apparent to a person of ordinary skill in the art and in view of alternative embodiments illustrated in FIGS. 7 and 8, to be described below. The openings 204 represent any openings, recesses, or trenches that are to be filled with a dielectric material and the filled dielectric material is to be planarized or recessed. In the embodiments illustrated in FIGS. 2, 3, 4A-4D, 5A-5D, and 6 the openings 204 may be openings and recesses between fin structures, which are to be filled with a dielectric material to form an isolation feature, such as a shallow trench isolation (STI) feature. In embodiments illustrated in FIG. 7, the openings 204 may be gate cut openings that divide a gate structure into gate structure segments. In embodiments illustrated in FIG. 8, the openings 204 may be self-aligned contact (SAC) openings defined between gate spacer layers.

In embodiments where the openings 204 are openings and recesses between fin structures, method 100 may be integrated with a process to form a fin-type field effect transistor (FinFET). In those embodiments, method 100 is preceded by a process for patterning the substrate 202 to form a fin structure 205. In some implementations, the patterning process may be a double-patterning or a multi-patterning process. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structure 205 by etching the substrate 202. The etching process can include dry etching, wet etching, reactive ion etching (RIE), and/or other suitable processes.

In some embodiments represented in FIG. 2, the openings 204 may not be evenly-spaced. For example, the first opening 204A and the second opening 204B are adjacent to one another and the third opening 204C is spaced apart from the first opening 204A and the second opening 204B. In this regard, the first opening 204A and the second opening 204B are disposed in a dense region while the third opening 204C is disposed in a loose region.

Figure 3:
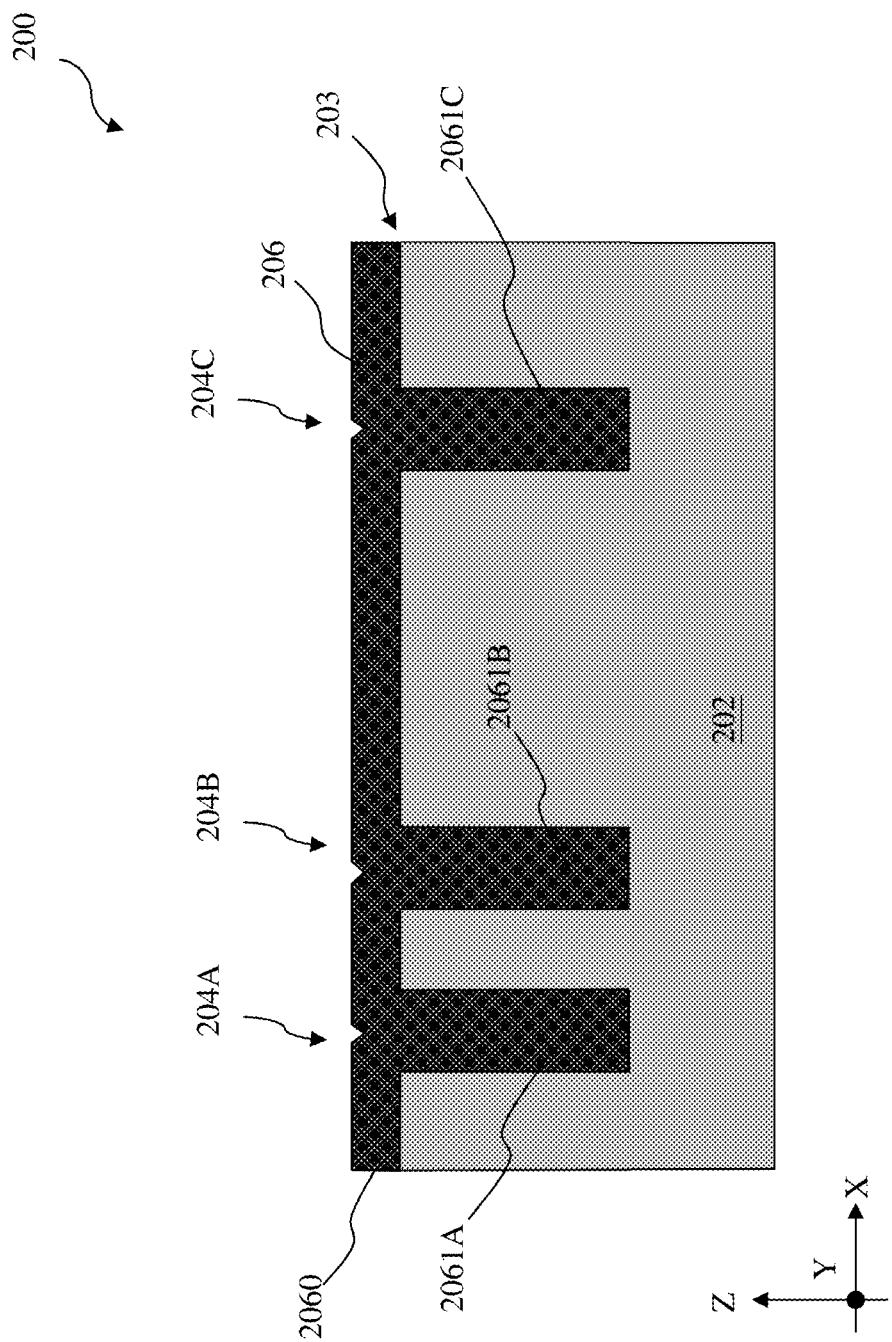

Referring now to FIGS. 1 and 3, the method 100 may include a block 104 where a dielectric material is deposited over the workpiece 200 to form a first dielectric layer 206 over the workpiece 200. The first dielectric layer 206 is not only formed in the openings 204 but also over the top surface 203 of the workpiece 200. For ease of reference, the portion of the first dielectric layer 206 that is disposed over the top surface 203 may be referred to as a top portion 2060 and the portions of the first dielectric layer 206 that is disposed in the openings 204 may be referred to as the first dielectric plug 2061A, the second dielectric plug 2061B, and the third dielectric plug 2061C, respectively. The first dielectric plug 2061A, the second dielectric plug 2061B, and the third dielectric plug 2061C may be collectively referred to as the dielectric plugs 2061. While the first dielectric layer 206 is illustrated as a single layer formed of a single dielectric material, the present disclosure is not so limited and the first dielectric layer 206 may include multiple sublayers formed of different dielectric materials.

In some embodiments, the dielectric material may be deposited using atomic layer deposition (ALD), chemical vapor deposition (CVD), plasma-enhanced CVD (PECVD), high density plasma CVD (HDP-CVD), sub-atmospheric CVD (SACVD), high-aspect ratio process (HARP), or other suitable deposition processes. In some implementations where the openings 204 have a width between about 3 nm and about 30 nm, the dielectric material may be deposited using ALD at block 104. In embodiments where ALD is used at block 104, the ALD may include a carrier gas, such as helium or argon, and a process temperature between about 150° C. and about 650° C. Depending on the types of the openings 204, the selections of the dielectric material may vary. In embodiments where the openings 204 are recesses between fin structures, the dielectric material may include semiconductor oxides, semiconductor nitrides, semiconductor oxynitrides, fluorinated silica glass (FSG), low-K dielectric materials, and/or combinations thereof. Semiconductor oxides may include silicon oxide, semiconductor nitrides may include silicon nitride, semiconductor oxynitrides may include silicon oxynitride. In some implementations, the dielectric material may be silicon-containing dielectric material and may be represented as $Si_aN_bC_cO_d$, where a is between about 0.30 and 0.45, b is between about 0.10 and about 0.45, c is between about 0.01 and about 0.20, and d is between about 0.05 and about 0.55. In these implementations, the silicon-containing dielectric material may include H dangling bond for low-k properties.

Referring now to FIGS. 1 and 4A-4D, the method 100 includes a block 106 where the first dielectric layer 206 is treated to convert the top portion 2060 of the first dielectric layer 206 into a second dielectric layer 208 different from the first dielectric layer 206. In some embodiments, the second dielectric layer 208 is different from the first dielectric layer 206 in terms of composition. Depending on the treatment used at block 106, the second dielectric layer 208 may have different compositions, such as the second dielectric layer 208-1 in FIG. 4A, the second dielectric layer 208-2 in FIG. 4B, the second dielectric layer 208-3 in FIG. 4C, and the second dielectric layer 208-4 in FIG. 4D. The purpose of the operations at block 106 is to increase or decrease etching selectivity of the second dielectric layer 208 relative to the first dielectric layer 206 to enable selective or more controllable etching of the second dielectric layer 208. In some instances, an etching selectivity of the second dielectric layer 208 relative to the first dielectric layer 206 (a ratio of the etching rate of the second dielectric layer 208 to the etching rate of the first dielectric layer 206) may be between about 0.1 and about 10.

Figure 4A:
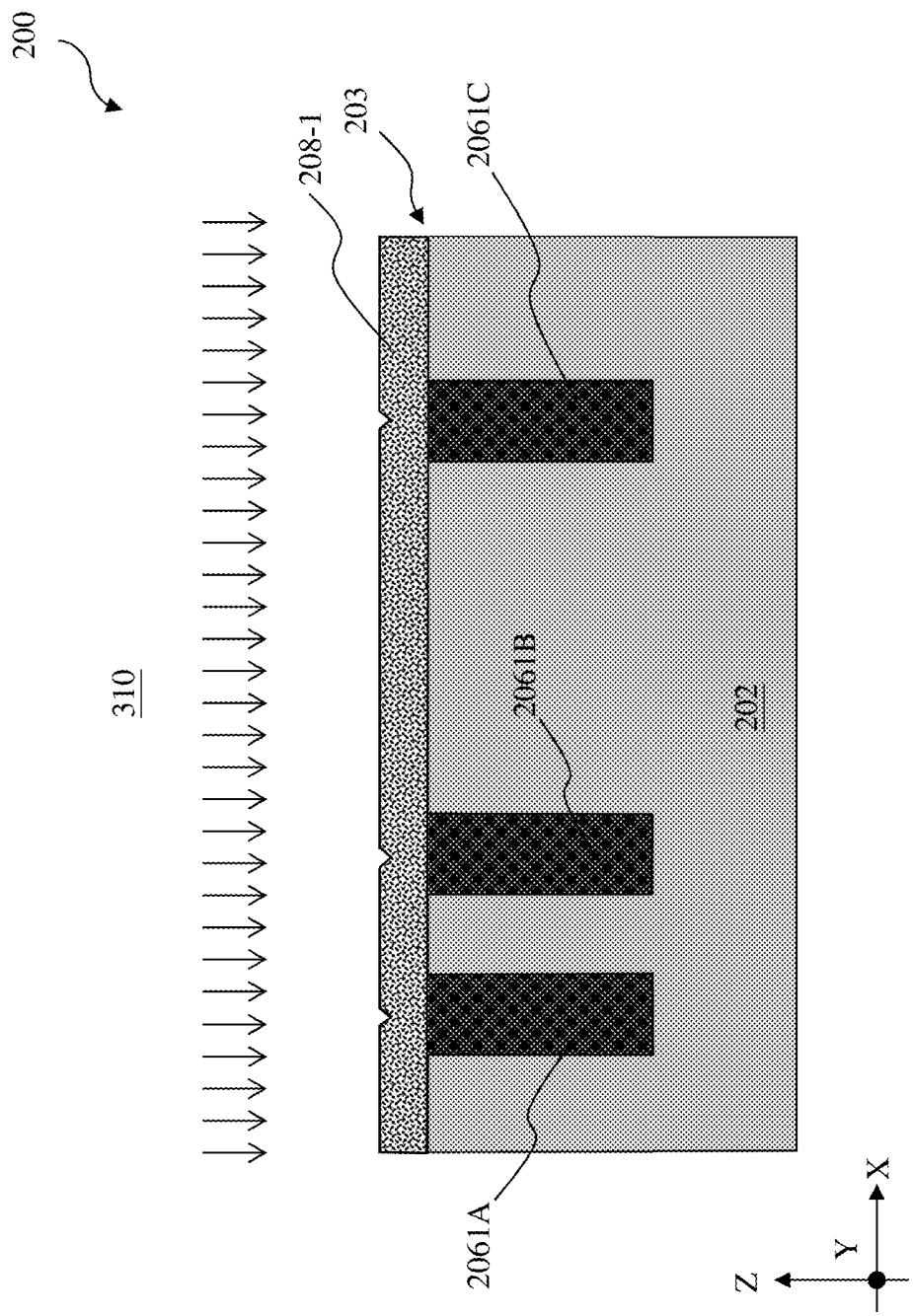

In embodiments represented in FIG. 4A, the first dielectric layer 206 is treated with an oxygenation process 310 to convert the top portion 2060 of the first dielectric layer 206 into an oxygenated second dielectric layer 208-1. In some implementations, the oxygenation process 310 may cause an oxygen source to react with the top portion 2060 to convert silicon-nitrogen (Si—N) bonding and silicon-carbon (Si—C) bonding to silicon-oxygen (Si—O), resulting in an increase in oxygen content in the oxygenated second dielectric layer 208-1. That is, the oxygenated second dielectric layer 208-1 includes an oxygen content greater than an oxygen content of the first dielectric layer 206. In some instances, the oxygen source in the oxygenation process 310 may include oxygen plasma, oxygen radical (O2*), ozone, or water. The temperature of the oxygenation process 310 is between about 0° C. and about 700° C. Because the purpose of the operations at block 106 is to create etching selectivity by introducing compositional differences, when the oxygenation process 310 is used at block 106, the first dielectric layer 206 may be oxygen poor such that the oxygen-rich oxygenated second dielectric layer 208-1 may be more different from the first dielectric layer 206 in terms of composition. In some embodiments, the oxygenation process 310 may remove moisture in the first dielectric layer 206 (that will not be removed) and reduce the dielectric constant of the first dielectric layer 206.

Figure 4B:
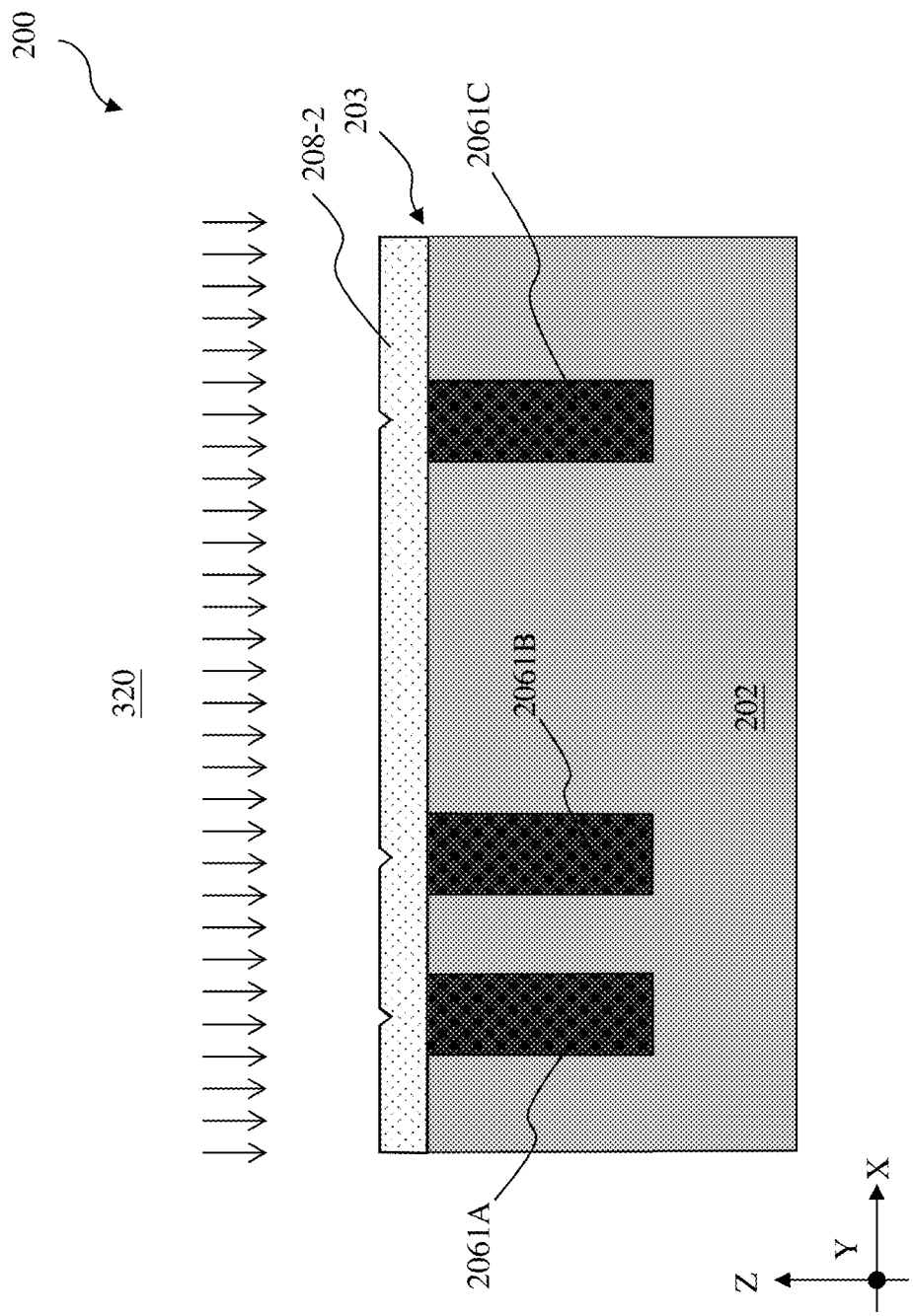

In embodiments represented in FIG. 4B, the first dielectric layer 206 is treated with a nitridation process 320 to convert the top portion 2060 of the first dielectric layer 206 into the nitridated second dielectric layer 208-2. In some implementations, the nitridation process 320 may cause a nitrogen source to react with the top portion 2060 to convert silicon-oxygen (Si—O) bonding and silicon-carbon (Si—C) bond to silicon-nitrogen (Si—N) bonding, resulting in an increase in nitrogen content in the nitridated second dielectric layer 208-2. That is, the nitridated second dielectric layer 208-2 includes a nitrogen content greater than a nitrogen content of the first dielectric layer 206. In some instances, the nitrogen source in the nitridation process 320 may include ammonium, ammonium radical, nitrous oxide (N2O), nitrogen plasma, or nitrogen radical. The temperature of the nitridation process 320 is between about 200° C. and about 700° C. Because the purpose of the operations at block 106 is to create etching selectivity by introducing compositional differences, when the nitridation process 320 is used at block 106, the first dielectric layer 206 may be nitrogen poor such that the nitrogen-rich nitridated second dielectric layer 208-2 may be more different from the first dielectric layer 206 in terms of composition.

Figure 4C:
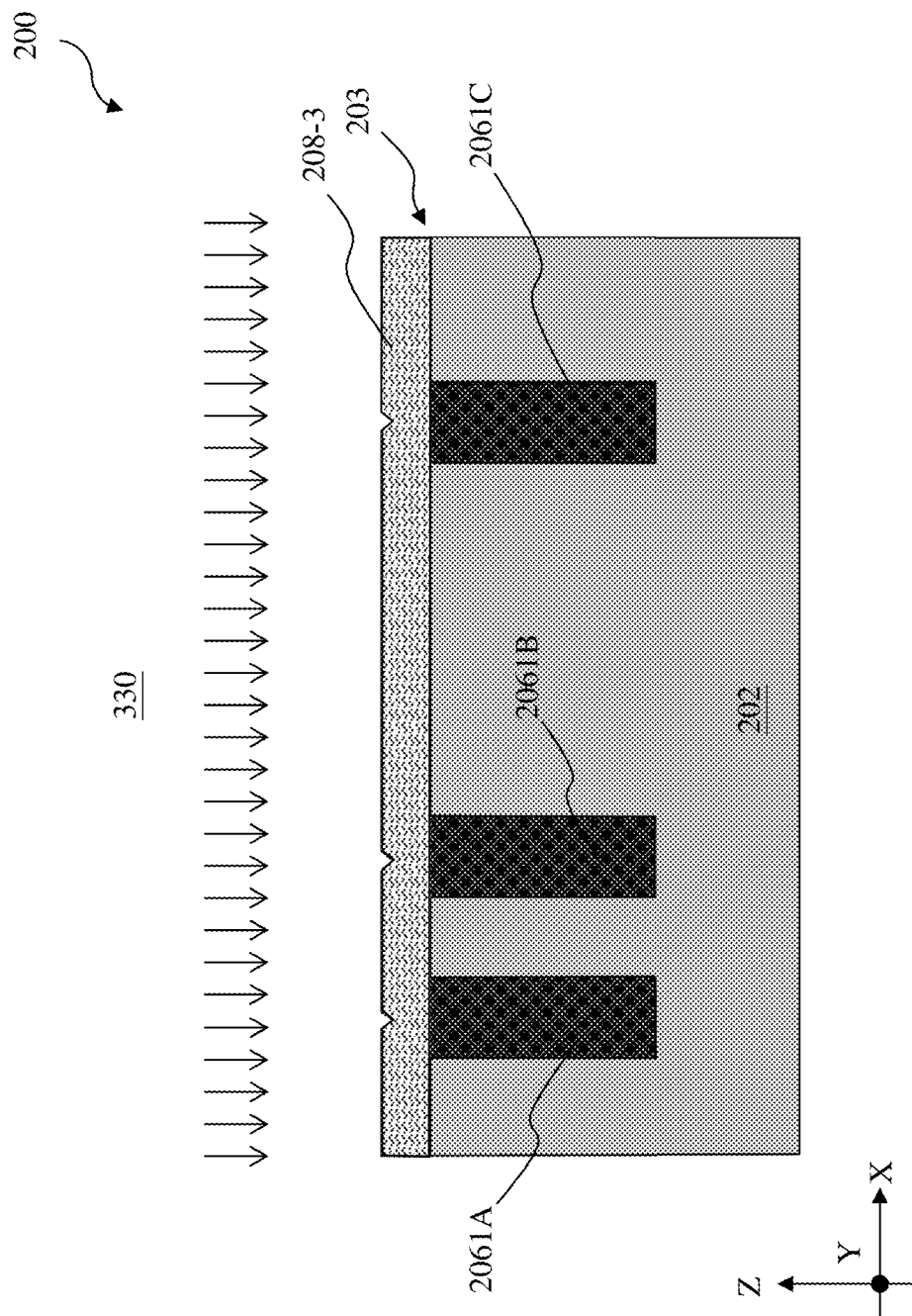

In embodiments represented in FIG. 4C, the first dielectric layer 206 is treated with a hydrogenation process 330 to convert the top portion 2060 of the first dielectric layer 206 into the hydrogenated second dielectric layer 208-3. In some implementations, the hydrogenation process 330 may cause a hydrogen source to react with the top portion 2060 to remove dangling hydrogen bond (i.e. —H), resulting in a decrease in dangling hydrogen bond or hydrogen content in the second dielectric layer 208-3. In some instances, the hydrogen source in the hydrogenation process 330 may include hydrogen, hydrogen plasma, or hydrogen radical (H2*). The temperature of the hydrogenation process 330 is between about 200° C. and about 500° C. Because the purpose of the operations at block 106 is to create etching selectivity by introducing compositional differences, when the hydrogenation process 330 is used at block 106, the first dielectric layer 206 may be formed of a material with more dangling hydrogen bond such that the hydrogenated second dielectric layer 208-3 may be more different from the first dielectric layer 206 in terms of composition. In some embodiments, the hydrogenation process 330 may remove moisture in the first dielectric layer 206 (that will not be removed) and reduce the dielectric constant of the first dielectric layer 206.

Figure 4D:
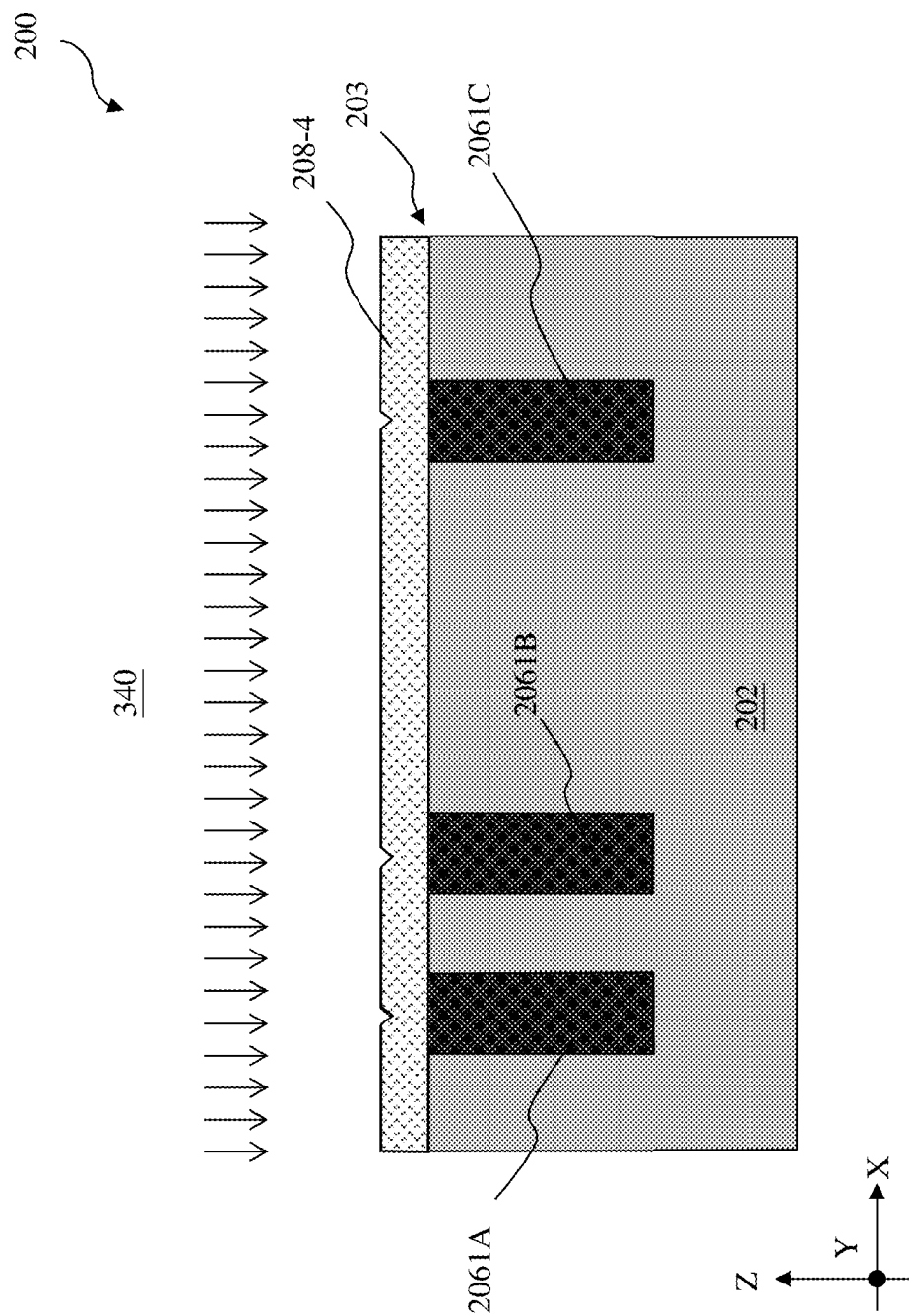

In embodiments represented in FIG. 4D, the first dielectric layer 206 is treated with an ultraviolet (UV) curing process 340 to convert the top portion 2060 of the first dielectric layer 206 into the cured second dielectric layer 208-4. In some implementations, the UV curing process 340 may cure or passivate reactive functional groups in the top portion 2060 to form the cured second dielectric layer 208-4. The temperature of the UV curing process 340 is between about 0° C. and about 500° C. Because the purpose of the operations at block 106 is to create etching selectivity by introducing compositional differences, when the UV curing process 340 is used at block 106, the first dielectric layer 206 may be formed of a material with more reactive functional groups such that the cured second dielectric layer 208-4 may be more different from the first dielectric layer 206 in terms of composition or reactivity.

It is noted that, for ease of reference and description of the oxygenated second dielectric layer 208-1, the nitridated second dielectric layer 208-2, the hydrogenated second dielectric layer 208-3, and the cured second dielectric layer 208-4 may be collectively referred to as the second dielectric layer 208 that is treated one way or another at block 106 of the method 100.

Referring now to FIGS. 1 and 5A-5D, the method 100 may include a block 108 where the second dielectric layer 208 is selectively removed by an etching process. At block 108, the second dielectric layer 208 may be selectively removed using dry etch, wet etch, or plasma descum. In embodiments where dry etch is used, dry etchants may include fluorocarbons (such as CF4, C2F6, C3F8, etc.), nitrogen fluorides (such as NF3), ammonia, hydrogen, hydrogen halides (such as HCl, HF, HBr, etc.). In embodiments where wet etch is used, wet etchants may include hydrofluoric acid, SC1 (a mixture of NH4OH, H2O2 and H2O), SC2 (a mixture of HCl, H2O2 and H2O), SPM (a mixture of H2SO4 and H2O2), phosphoric acid, hydrochloric acid, hydrogen peroxide. In embodiments where descum is used, the descuming agents may include oxygen, hydrogen, and ammonia.

Figure 5A:
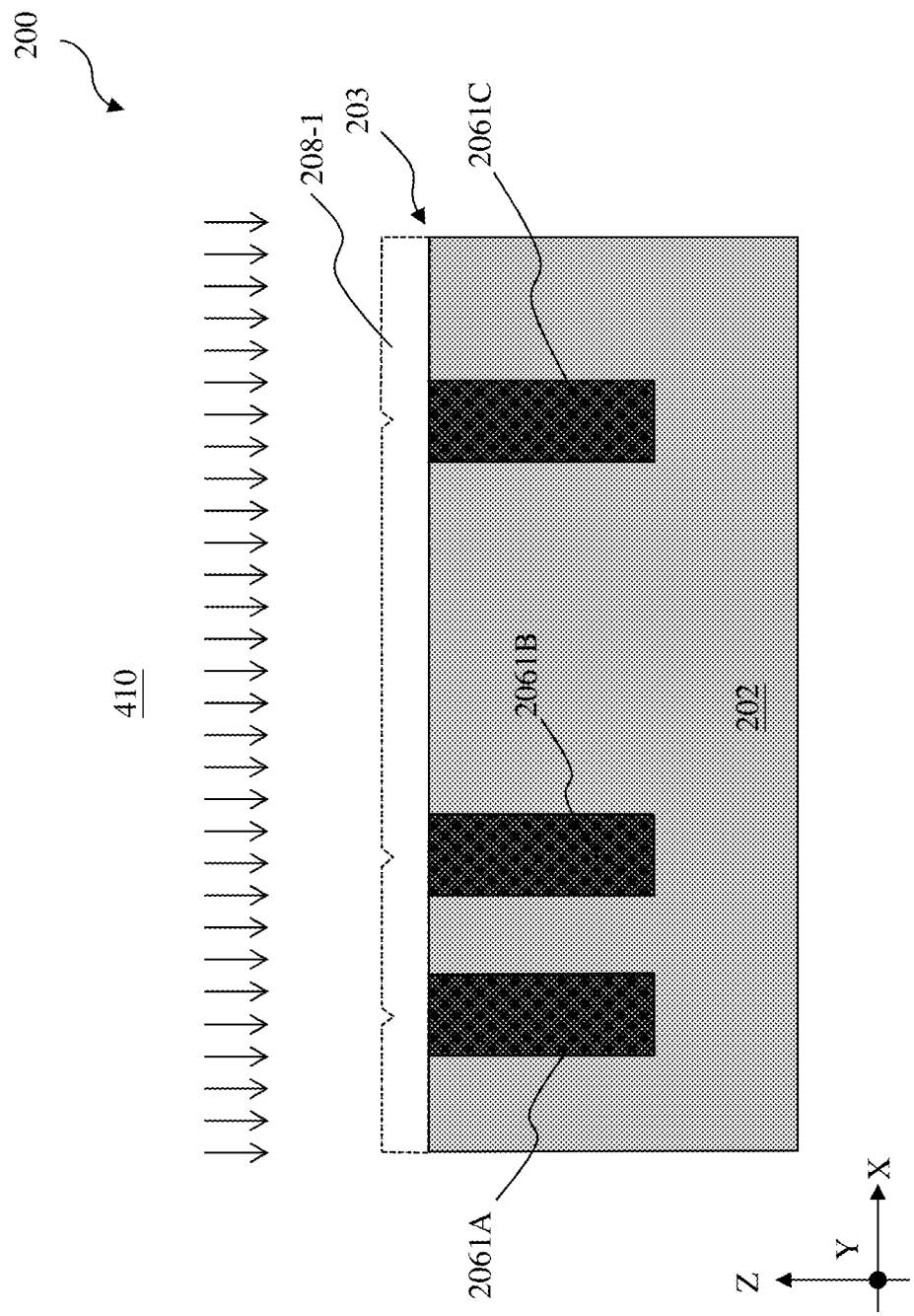

In embodiments represented in FIG. 5A, the oxygenated second dielectric layer 208-1 may be removed by a first etching process 410. In some embodiments, the first etching process 410 is selected such that it can selectively remove the oxygenated second dielectric layer 208-1 without substantially damaging the dielectric plugs 2061 and the top surface 203. For example, the first etching process 410 may be a dry etching process using an etching gas mixture of fluorocarbons and hydrogen. In some instances, the first etching process 410 may be a reactive ion etching (RIE) process. In some implementations, the first etching process 410 may include a remote hydrogen discharge. For another example, the first etching process 410 may be a wet etching process using a hydrofluoric acid solution as the wet etchant.

Figure 5B:
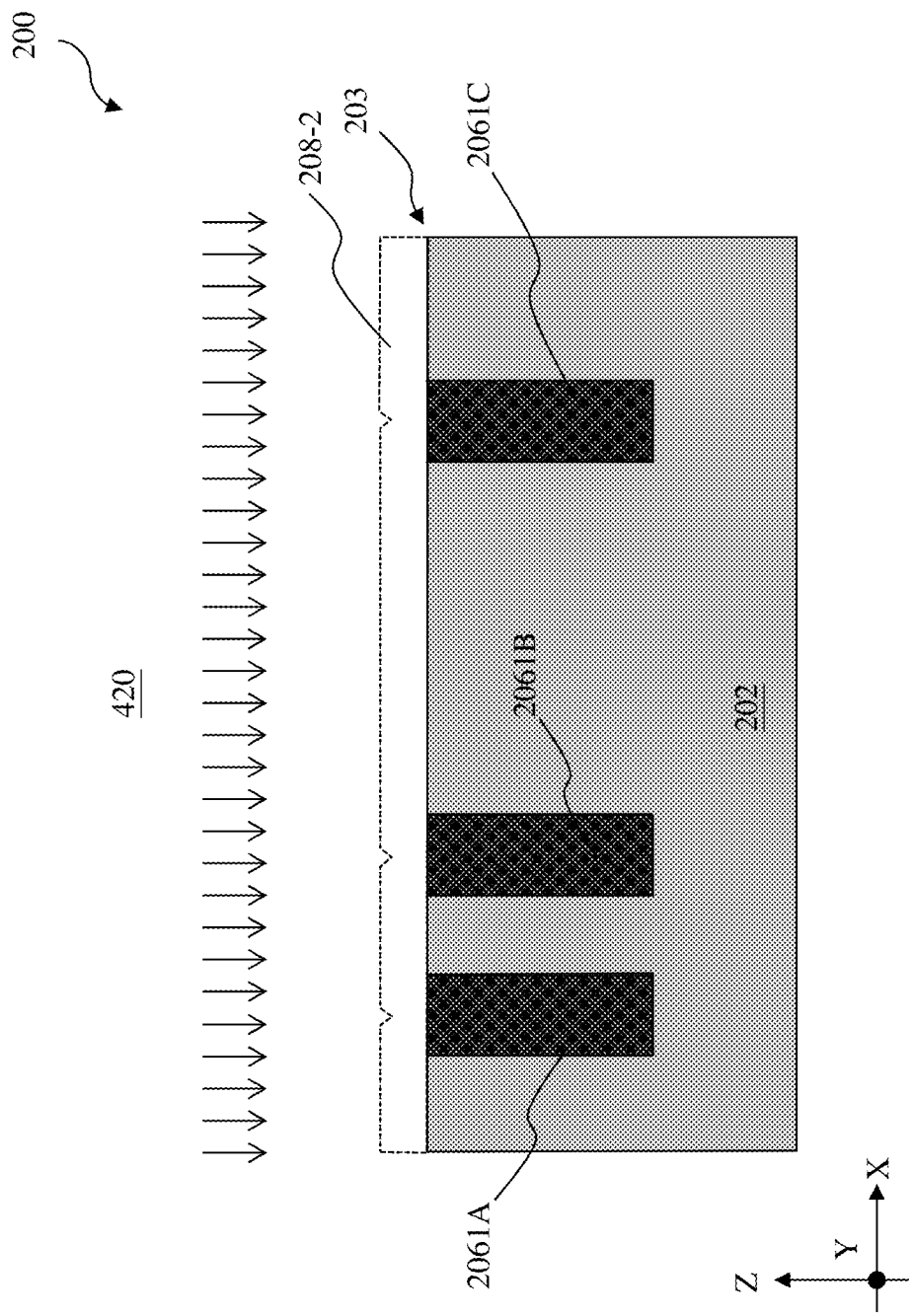

In embodiments represented in FIG. 5B, the nitridated second dielectric layer 208-2 may be removed by a second etching process 420. In some embodiments, the second etching process 420 is selected such that it can selectively remove the nitridated second dielectric layer 208-2 without substantially damaging the dielectric plugs 2061 and the top surface 203. For example, the second etching process 420 may be a dry etching process using an etching gas mixture that includes fluorocarbons, nitrogen fluorides, oxygen, and nitrogen. In some instances, the second etching process 420 may be a reactive ion etching (RIE) process. In some implementations, the second etching process 420 may include a remote oxygen or nitrogen discharge. For another example, the second etching process 420 may be a wet etching process using phosphoric acid as the wet etchant.

Figure 5C:
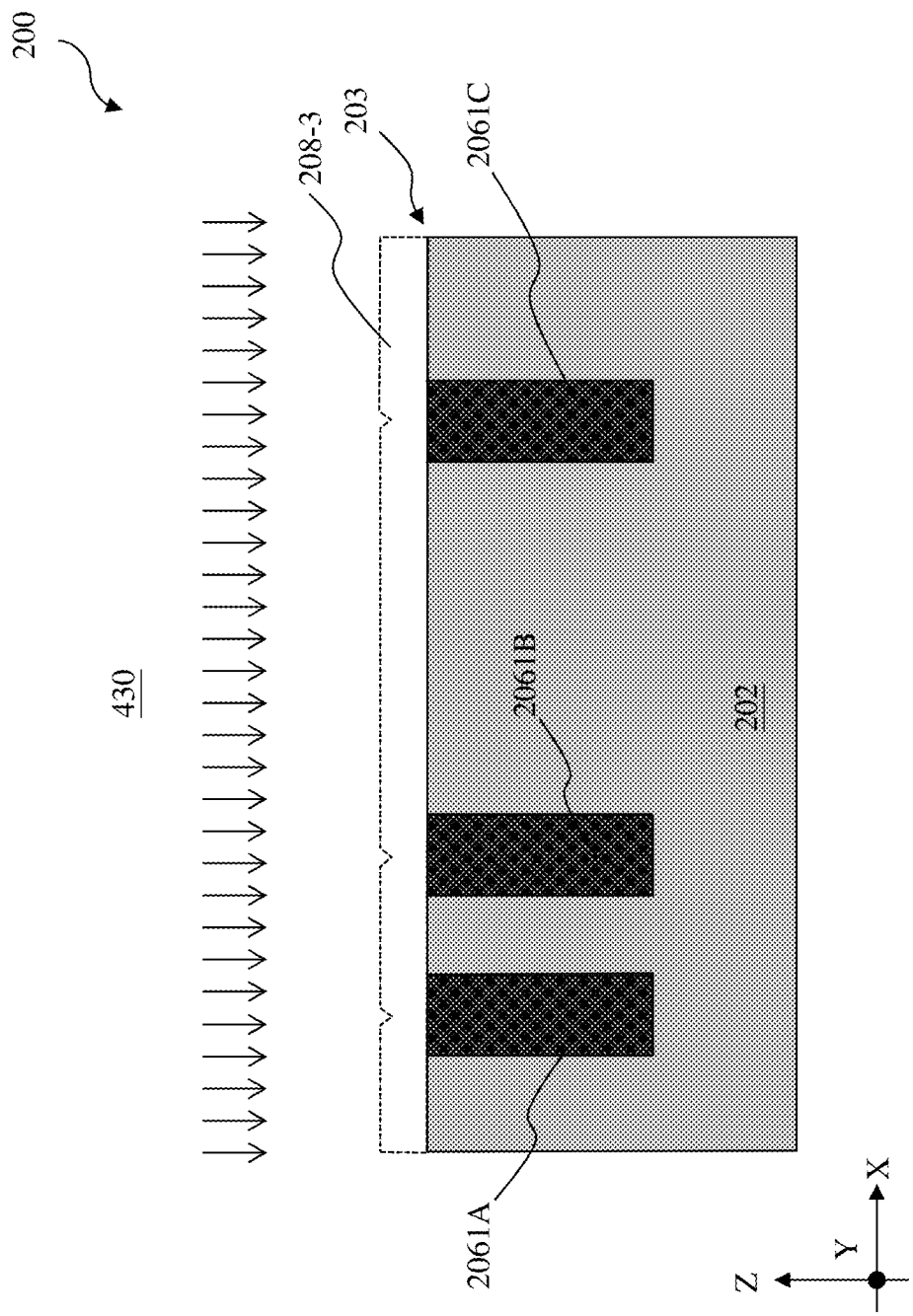

In embodiments represented in FIG. 5C, the hydrogenated second dielectric layer 208-3 may be removed by a third etching process 430. In some implementations, the hydrogenated second dielectric layer 208-3 may etch slower than the first dielectric layer 206 such that the etch of the hydrogenated second dielectric layer 208-3 may be better metered and controlled. For example, the change in etch rate when the top surface 203 is reached may allow better detection of an etch stop point. In these embodiments, the third etching process 430 may be a dry etch process or a descum process.

Figure 5D:
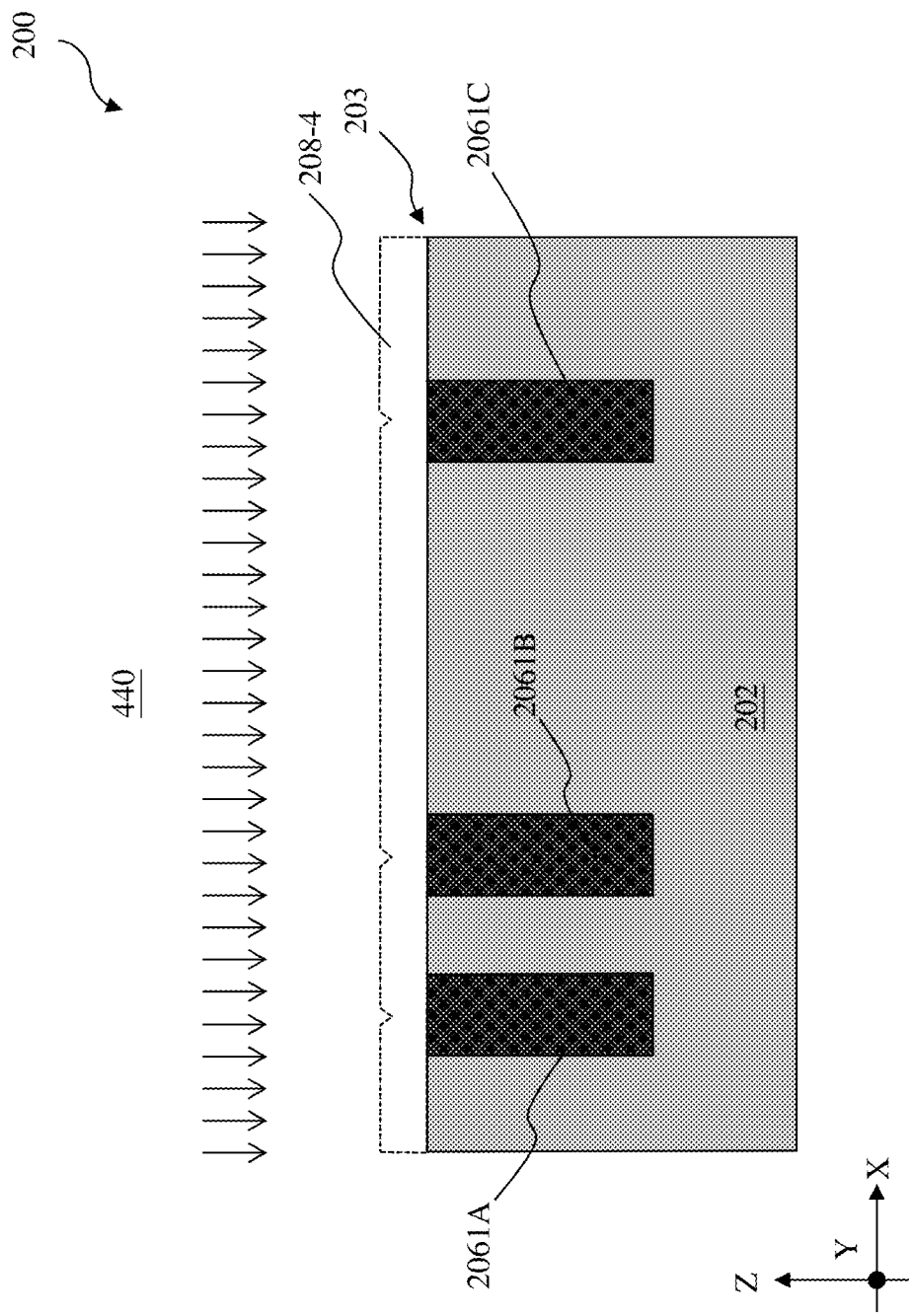

In embodiments represented in FIG. 5D, the cured second dielectric layer 208-4 may be removed by a fourth etching process 440. In some implementations, the cured second dielectric layer 208-4 may become less reactive and etch slower than the first dielectric layer 206 such that the etch of the cured second dielectric layer 208-4 may be better metered and controlled. For example, the change in etch rate when the top surface 203 is reached may allow better detection of an etch stop point. In these embodiments, the fourth etching process 440 may be a dry etch process or a descum process.

Referring now to FIG. 1, the method 100 may alternatively include a block 107 and a block 109 wherein a cyclic process of treating and selective removing is performed until the top portion 2060 of the first dielectric layer 206 is removed. The cyclic process includes a plurality of cycles and each of the plurality of cycles includes operations at block 107 and operations at block 109. In some embodiments, depending on the property or porosity of the first dielectric layer 206, the controllable treatment depth may be between about 1 nm and about 10 nm. That is, the controllable treatment depth may be less than a thickness (along the Z direction) of the top portion 2060 (shown in FIG. 3). In those embodiments, only a depth of the top portion 2060 may be treated to convert to a treated dielectric layer at block 107 and then the treated dielectric layer may be selectively removed at block 109. The operations at blocks 107 and 109 may repeat until the entirety of the top portion 2060 is removed. That is, the cyclic process may include a plurality of the treating process at block 107 and a plurality of the selectively removing process at block 109 until the entirety of the top portion 2060 of the first dielectric layer 206 is removed. It is noted that the operations at block 107 are similar to operations at block 106 and they are different in terms of whether the top portion 2060 may be removed with one treatment step and one selective removal step or whether multiple treatment steps and multiple selective removal steps are needed to achieve a satisfactory result.

The method 100 does not require any planarization process before further processes are performed to the workpiece 200. That is, planarization process such as CMP processes, may be omitted. In this regard, the operations at blocks 106 and 108 or blocks 107 and 109 may serve as alternative processes for surface planarization as the top surface 203 and the dielectric plugs 2061 may come out as being coplanar at the conclusion of block 108 or the last of blocks 109. In addition, the operations at blocks 106, 107, 108, and 109 may be performed in a single wafer process, in a multi-wafer process, in a furnace, or in a multi-chamber rotary apparatus. In some embodiments, the operations at blocks 106, 107, 108, and 109 are performed in a multi-chamber rotary apparatus such that the workpiece 200 is not required to be removed from the multi-chamber rotary apparatus for planarization processes, such as a CMP. This can reduce the number of stations and process time in the manufacturing process of the semiconductor device and increase throughput. When a CMP process is used in a conventional process, a relatively thicker dielectric dummy layer may be necessary to prevent over-polishing. By doing away with the CMP process, the relatively thicker dielectric dummy layer may be omitted.

Figure 6:
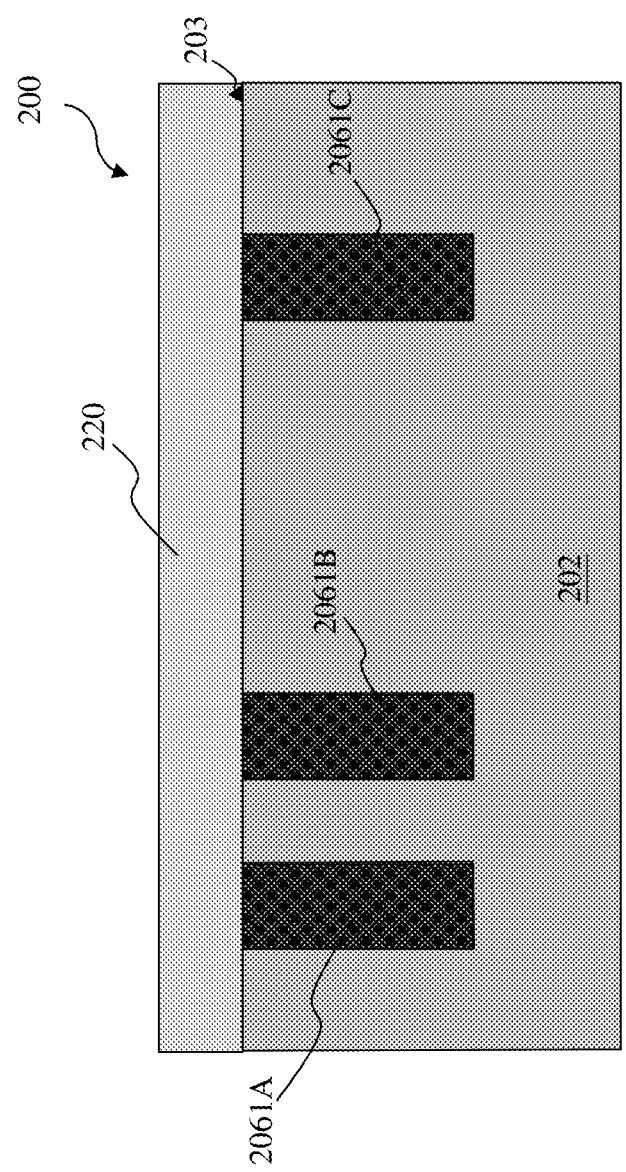
FIG. 6 is a fragmentary cross-sectional view of a workpiece having a material layer over the dielectric plug according to some embodiments of the present disclosure.

Referring now to FIGS. 1 and 6, the method 100 may include a block 110 where further processes may be performed. In some embodiments, the further processes include forming a material layer 220 over the workpiece 200. Depending on the applications, the material layer 220 may be a hard mask layer or a dielectric layer. In implementations where the material layer 220 is a hard mask layer, the material layer 220 may include a dielectric material such as semiconductor oxide, semiconductor nitride, semiconductor oxynitride, and/or semiconductor carbide. In an example, the material layer 220 includes a silicon oxide layer and a silicon nitride layer. The hard mask layer may be formed by thermal growth, ALD, CVD, high density plasma CVD (HDP-CVD), other suitable deposition processes. A photoresist layer (or resist) may be deposited on the hard mask layer to pattern the hard mask layer using photolithography techniques. In other implementations where the material layer 220 is a dielectric layer, the material layer 220 may be formed of silicon oxide, silicon nitride, silicon oxynitride, silicon oxycarbonitride, or silicon carbonitride.

Figure 7:
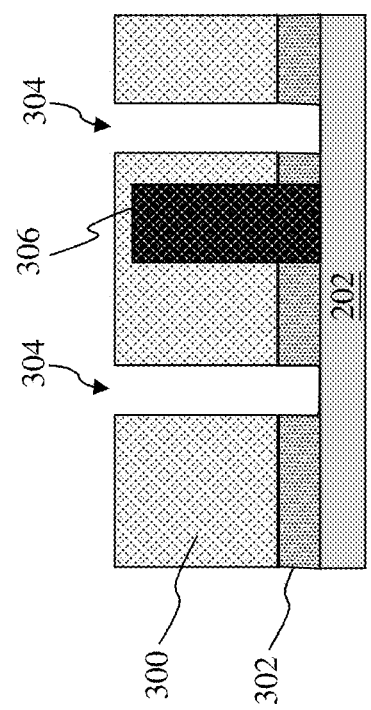

Method 100 of the present disclosure may be applicable to form dielectric plugs or features in openings other than those formed between fin structures. Example applications of the method 100 are representatively shown in FIGS. 7 and 8. As illustrated in FIG. 7, method 100 may be applied to forming a dielectric plug (or gate cut feature) in a gate cut opening 304 shown in FIG. 7 and integrated with a gate cut process (also referred to as a cut gate process) or metal gate cut process (also referred to as a cut metal gate process). Referring first to FIG. 7, the workpiece 200 may include a semiconductor fin structure 306 disposed over the substrate 202 and extending through an STI layer 302. A gate stack 300 extends over and wraps around the semiconductor fin structure 306. The gate stack 300 may be a dummy gate stack formed of, for example, polysilicon, or a metal gate stack formed of, one or more metals. In embodiments represented in FIG. 7, a gate cut opening 304 completely extends through the gate stack 300 to sever the gate stack 300 into gate stack segments. The gate cut opening 304 therefore extends at least partially into the STI layer 302. In this example application of method 100, method 100 is used to form a dielectric plug (or referred to as gate cut feature) in the gate cut opening 304 by depositing a reverse material (corresponding to the first dielectric layer 206 described above) into to the gate cut opening 304. The reverse material may include silicon nitride, silicon oxynitride, silicon oxide, silicon oxycarbonitride, silicon carbonitride, silicon oxycarbide, or a combination thereof. In this example application, method 100 is preceded by a process for patterning the gate stack 300 to form the gate cut opening 304 shown in FIG. 7. The patterning of the gate stack 300 may be performed using dry etching, wet etching, reactive ion etching (RIE), and/or other suitable processes. In this example application of method 100, method 100 may be followed by a gate replacement process where the polysilicon gate stack 300 is replaced by a metal gate stack. Method 100 may also be followed by formation of contact structures, such as gate contacts or source/drain contacts, when the gate stack 300 is formed of one or more metal.

Figure 8:
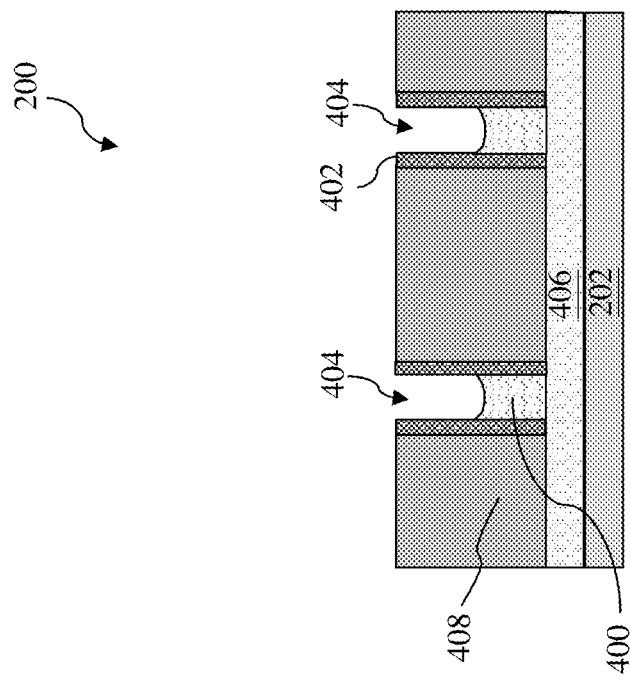
FIGS. 7 and 8 are fragmentary cross-sectional views of a workpiece with an opening, according to some embodiments of the present disclosure.

As illustrated in FIG. 8, method 100 may be applied to forming a self-aligned contact (SAC) dielectric plug in an SAC opening 404 and integrated with a gate contact formation process. Referring now to FIG. 8, the workpiece 200 may include metal gate stacks 400 and a gate spacer layer 402 disposed on sidewalls of the metal gate stacks 400. At least a portion of the metal gate stacks 400 is disposed on a STI layer 406. The space between metal gate stacks 400 is filled with a dielectric layer 408, such as an interlayer dielectric (ILD) layer. In embodiments represented in FIG. 8, the SAC opening 404 is defined between the gate spacer layers 402 disposed on sidewalls of the metal gate stack 400. As shown in FIG. 8, the SAC opening 404 exposes the metal gate stack 400. Method 100 is used to deposit a dielectric material in the SAC opening to form an SAC dielectric plug. The dielectric material for the SAC dielectric plug (corresponding to the first dielectric layer 206 described above) may include silicon oxide, silicon nitride, silicon carbide, silicon oxynitride, silicon oxy-carbide, silicon carbonitride, silicon oxycarbonitride, aluminum oxide, aluminum oxynitride, aluminum nitride, zirconium oxide, zirconium aluminum oxynitride, aluminum nitride, amorphous silicon, or a combination thereof. In this example application, method 100 is preceded by a process for removing gate top hard mask layers disposed over the metal gate stack 400 to form the SAC opening 404 shown in FIG. 8. The removal of the gate top hard mask layers may be performed using dry etching or wet etching that selectively remove the gate top hard mask layers without substantially etching the gate spacer layers. In such an integrated process, method 100 may be followed by deposition of an SAC dielectric layer in the SAC opening 404.

While not shown, method 100 of the present disclosure may be applicable to other aspects of semiconductor device processes. For example, fin cut openings may be formed through fin structures for a FinFET device or a fin-shape active region for a gate-all-around (GAA) device in order to separate active region into different channel regions. In that example, method 100 may be used to form the channel isolation dielectric feature in the fin cut openings. Dielectric materials for the channel isolation dielectric feature may include silicon nitride, silicon oxynitride, silicon oxide, silicon oxycarbonitride, silicon carbonitride, silicon oxycarbide, or a combination thereof. For another example, inner spacer recesses may be formed between channel members of a GAA device. In that example, method 100 may be used to form an inner spacer feature in the inner spacer recesses. Dielectric materials for the inner spacer feature may include silicon oxycarbide, silicon oxycarbonitride, or silicon nitride. For clarity and brevity, the operations in the method 100 will not be separately described with respect to each of the various example applications of methods 100.

Based on the above discussions, it can be seen that the present disclosure offers advantages over conventional methods and semiconductor structures. It is understood, however, that other embodiments may offer additional advantages, and not all advantages are necessarily disclosed herein, and that no particular advantage is required for all embodiments. For example, the present disclosure provides a method of filling an opening in a workpiece with a dielectric plug (or a dielectric feature) formed of a first dielectric material. The method of the present application includes treating excess first dielectric material deposited over the workpiece to convert it to a second dielectric layer and selectively removing the second dielectric layer. A planarization process, such as CMP, may be entirely omitted if the method of the present disclosure is adopted. The omission of the planarization process not only avoids undesirable side effect of the planarization process but also increases manufacturing throughput because the workpiece 200 does not need to be removed from rotary tools for planarization.

Thus, the present disclosure provides a method in accordance with some embodiments. The method includes providing a workpiece including an opening and a top surface, depositing a dielectric material over the workpiece and into the opening to form a first dielectric layer, wherein the first dielectric layer comprises a top portion over the top surface and a plug portion in the opening, treating the first dielectric layer to convert top portion into a second dielectric layer different from the first dielectric layer, and selectively removing the second dielectric layer.

In some embodiments, the dielectric material includes silicon. In some implementations, the treating of the first dielectric layer includes an oxygenation process. In these implementations, an oxygen content of the second dielectric layer is greater than an oxygen content of the first dielectric layer. In some other implementations, the treating of the first dielectric layer includes a nitridation process. In these implementations, a nitrogen content of the second dielectric layer is greater than a nitrogen content of the first dielectric layer. In some alternative implementations, the treating of the first dielectric layer includes a hydrogenation process. In these implementations, a hydrogen content of the second dielectric layer is smaller than a hydrogen content of the first dielectric layer.

The present disclosure provides a method in accordance with other embodiments. The method includes providing a workpiece including an opening and a top surface; depositing a dielectric material over the workpiece and into the opening to form a first dielectric layer, wherein the first dielectric layer comprises a top portion over the top surface and a plug portion in the opening; treating the first dielectric layer to convert top portion into a second dielectric layer different from the first dielectric layer; selectively removing the second dielectric layer to expose the top surface and the plug portion; and depositing a material layer over the top surface and the plug portion.

In some embodiments, no chemical mechanical polishing (CMP) is performed after the selectively removing of the second dielectric layer and before the depositing of the material layer. In some instances, the top surface and a surface of the plug portion are coplanar after the selectively removing of the second dielectric layer. In some implementations, the treating of the first dielectric layer includes an oxygenation process at a temperature between about 0° C.

and about 700° C. In some other implementations, the treating of the first dielectric layer includes a nitridation process at a temperature between about 200° C. and about 700° C. In some alternative implementations, the treating of the first dielectric layer includes a hydrogenation process at a temperature between about 200° C. and about 500° C. In some alternative embodiments, the treating of the first dielectric layer includes using a plasma.

The present disclosure also provides a method of forming an integrated circuit structure in accordance with some embodiments. The method includes providing a workpiece including an opening and a top surface; depositing a dielectric material over the workpiece and into the opening to form a first dielectric layer, wherein the first dielectric layer comprises a top portion over the top surface and a plug portion in the opening; and removing the top portion, wherein the removing of the top portion comprises a plurality of cycles and each cycle includes treating a portion of the top portion of the first dielectric layer, and selectively removing the treated portion of the top portion.

In some implementations, the depositing of the dielectric material includes depositing the dielectric material using atomic layer deposition (ALD). In some instances, the workpiece includes an interlayer dielectric layer and the opening is defined in the interlayer dielectric layer. In some embodiments, the workpiece includes a gate structure disposed between two spacer layers and the opening is disposed over the gate structure and between the two spacer layers. In some implementations, the treating of the portion of the top portion includes an oxygenation process, a nitridation process, or a hydrogenation process.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   providing a workpiece comprising an opening and a top surface;
   depositing a dielectric material over the workpiece and into the opening to form a first dielectric layer, wherein the first dielectric layer comprises a top portion over the top surface and a plug portion in the opening;
   treating the first dielectric layer to convert the top portion into a second dielectric layer different from the first dielectric layer; and
   selectively removing the second dielectric layer.

2. The method of claim 1, wherein the dielectric material comprises silicon.

3. The method of claim 1, wherein the treating of the first dielectric layer comprises an oxygenation process.

4. The method of claim 3, wherein an oxygen content of the second dielectric layer is greater than an oxygen content of the first dielectric layer.

5. The method of claim 1, wherein the treating of the first dielectric layer comprises a nitridation process.

6. The method of claim 5, wherein a nitrogen content of the second dielectric layer is greater than a nitrogen content of the first dielectric layer.

7. The method of claim 1, wherein the treating of the first dielectric layer comprises a hydrogenation process.

8. The method of claim 7, wherein a hydrogen content of the second dielectric layer is smaller than a hydrogen content of the first dielectric layer.

9. A method, comprising:
   providing a workpiece comprising an opening and a top surface;
   depositing a dielectric material over the workpiece and into the opening to form a first dielectric layer, wherein the first dielectric layer comprises a top portion over the top surface and a plug portion in the opening;
   treating the first dielectric layer to convert the top portion into a second dielectric layer different from the first dielectric layer;
   selectively removing the second dielectric layer to expose the top surface and the plug portion; and
   depositing a material layer over the top surface and the plug portion.

10. The method of claim 9, wherein no chemical mechanical polishing (CMP) is performed after the selectively removing of the second dielectric layer and before the depositing of the material layer.

11. The method of claim 9, wherein the top surface and a surface of the plug portion are coplanar after the selectively removing of the second dielectric layer.

12. The method of claim 9, wherein the treating of the first dielectric layer comprises an oxygenation process at a temperature between about 0° C. and about 700° C.

13. The method of claim 9, wherein the treating of the first dielectric layer comprises a nitridation process at a temperature between about 200° C. and about 700° C.

14. The method of claim 9, wherein the treating of the first dielectric layer comprises a hydrogenation process at a temperature between about 200° C. and about 500° C.

15. The method of claim 9, wherein the treating of the first dielectric layer comprises using a plasma.

16. A method, comprising:
   providing a workpiece comprising an opening and a top surface;
   depositing a dielectric material over the workpiece and into the opening to form a first dielectric layer, wherein the first dielectric layer comprises a top portion over the top surface and a plug portion in the opening; and
   removing the top portion, wherein the removing of the top portion comprises a plurality of cycles and each cycle comprises:
      treating a portion of the top portion of the first dielectric layer, and
      selectively removing the treated portion of the top portion.

17. The method of claim 16, wherein the depositing of the dielectric material comprises depositing the dielectric material using atomic layer deposition (ALD).

18. The method of claim 16, wherein the workpiece comprises an interlayer dielectric layer and the opening is defined in the interlayer dielectric layer.

19. The method of claim 16,
   wherein the workpiece comprises a gate structure disposed between two spacer layers,
   wherein the opening is disposed over the gate structure and between the two spacer layers.

20. The method of claim 16, wherein the treating of the portion of the top portion comprises an oxygenation process, a nitridation process, or a hydrogenation process.

* * * * *